United States Patent [19]

Tani

[11] Patent Number: 5,931,963
[45] Date of Patent: Aug. 3, 1999

[54] FAULT SIMULATION APPARATUS

[75] Inventor: Takahiro Tani, Hyogo, Japan

[73] Assignees: Mitsubishi Electric Semiconductor Software Co., Ltd., Hyogo; Mitsubishi Denki Kabushiki Kaisha, Tokyo, both of Japan

[21] Appl. No.: 08/844,641

[22] Filed: Apr. 21, 1997

[30] Foreign Application Priority Data

Nov. 28, 1996 [JP] Japan .................................. 8-318002

[51] Int. Cl.⁶ .............................. G01R 31/28; G06F 3/00
[52] U.S. Cl. ......................... 714/741; 714/724; 395/500
[58] Field of Search ................................ 371/27.4, 27.1, 371/27.2, 22.1, 25.1, 26, 67.1; 364/264.3, 489, 490, 578; 395/500

[56] References Cited

U.S. PATENT DOCUMENTS

| 5,345,401 | 9/1994 | Tani | 364/578 |
|---|---|---|---|
| 5,701,254 | 12/1997 | Tani | 364/489 |
| 5,719,881 | 2/1998 | Yonetoku | 371/27 |

FOREIGN PATENT DOCUMENTS

8-30657  2/1996  Japan .

*Primary Examiner*—Trinh L. Tu
*Attorney, Agent, or Firm*—Leydig, Voit & Mayer, Ltd.

[57] ABSTRACT

A fault simulation apparatus includes an MOS transistor output signal strength determining portion for extracting the conductivity type of an MOS transistor in which an event such as a variation in signal level occurs. A control signal value is obtained from a control terminal, and an input signal value is obtained from an input terminal, and output signal strength when the event occurring MOS transistor is turned ON is determined. In the apparatus, fault simulation is performed depending upon the output signal strength determined by the output signal strength determining portion.

12 Claims, 11 Drawing Sheets

| SOURCE \ GATE | 0 | 1 |
|---|---|---|
| 0 | Z | 0 |
| 1 | Z | 1 |

FIG. 3
PRIOR ART

| SOURCE \ GATE | 0 | 1 |
|---|---|---|
| 0 | 0 | Z |
| 1 | 1 | Z |

| SOURCE \ GATE | 0 | 1 |
|---|---|---|
| 0 | Z | 0 |
| 1 | Z | 1th |

FIG.8

| SOURCE \ GATE | 0 | 1 |
|---|---|---|
| 0 | 0th | Z |
| 1 | 1 | Z |

| FAULT AT I1 OUTPUT END | NO FAULTS | NO FAULTS | NO FAULTS | NO FAULTS | SA1 | SA1 | SA1 | SA1 | SA0 | SA0 | SA0 | SA0 |
|---|---|---|---|---|---|---|---|---|---|---|---|---|
| SEL | 1 | 1 | 0 | 0 | 1 | 1 | 0 | 0 | 1 | 1 | 0 | 0 |
| DATA IN_A | 1 | 0 | 1 | 0 | 1 | 0 | 1 | 0 | 1 | 0 | 1 | 0 |
| DATA IN_B | 0 | 1 | 0 | 1 | 0 | 1 | 0 | 1 | 0 | 1 | 0 | 1 |
| NA | 1 | 0 | 2 | 2 | 1th | 0 | 2 | 2 | 1 | 0 | 1 | 0th |
| NB | 2 | 2 | 0 | 1 | 1 | 1th | 0 | 1 | 2 | 2 | 0th | 1 |
| DATA OUT | 1 | 0 | 0 | 1 | 0 | 0 | 0 | 1 | 1 | 1 | 1 | 1 |
| ACTUAL CIRCUIT | 1 | — | — | — | 0 | U | U | U | U | U | U | U |
| fault sim. DELECTION | — | — | — | — | D | U | U | U | U | U | D | U |
| Tester DELECTION | — | — | — | — | D | U | U | U | U | U | D | U |

FAULT SIMULATION APPARATUS

BACKGROUND OF THE INVENTION

1. Field of the Invention

The present invention relates to a fault simulation apparatus to verify the operation of a circuit having MOS transistors, and relates more particularly to a fault simulation apparatus in which circuit connection data items showing a logic circuit model equivalent to a logic circuit to be verified is constructed by a computer, and a switch level simulation of an event-driven method is carried out under excitation by an input signal applied from outside the logic circuit, thereby verifying quality of a logic circuit design, and evaluating fault coverage of a test pattern of the logic circuit.

2. Description of the Related Art

Unlike design according to an application specific IC (hereinafter abbreviated as ASIC) method, in a full-custom design method, circuit diagrams, for example, a flip-flop, a latch circuit, and a selector circuit at a gate design level or a switch design level are used. Hence, when a fault simulation is carried out according to a conventional method, a result is outputted as Possibility of Detected Fault in which a pseudo error is possibly detected.

Figure 1:
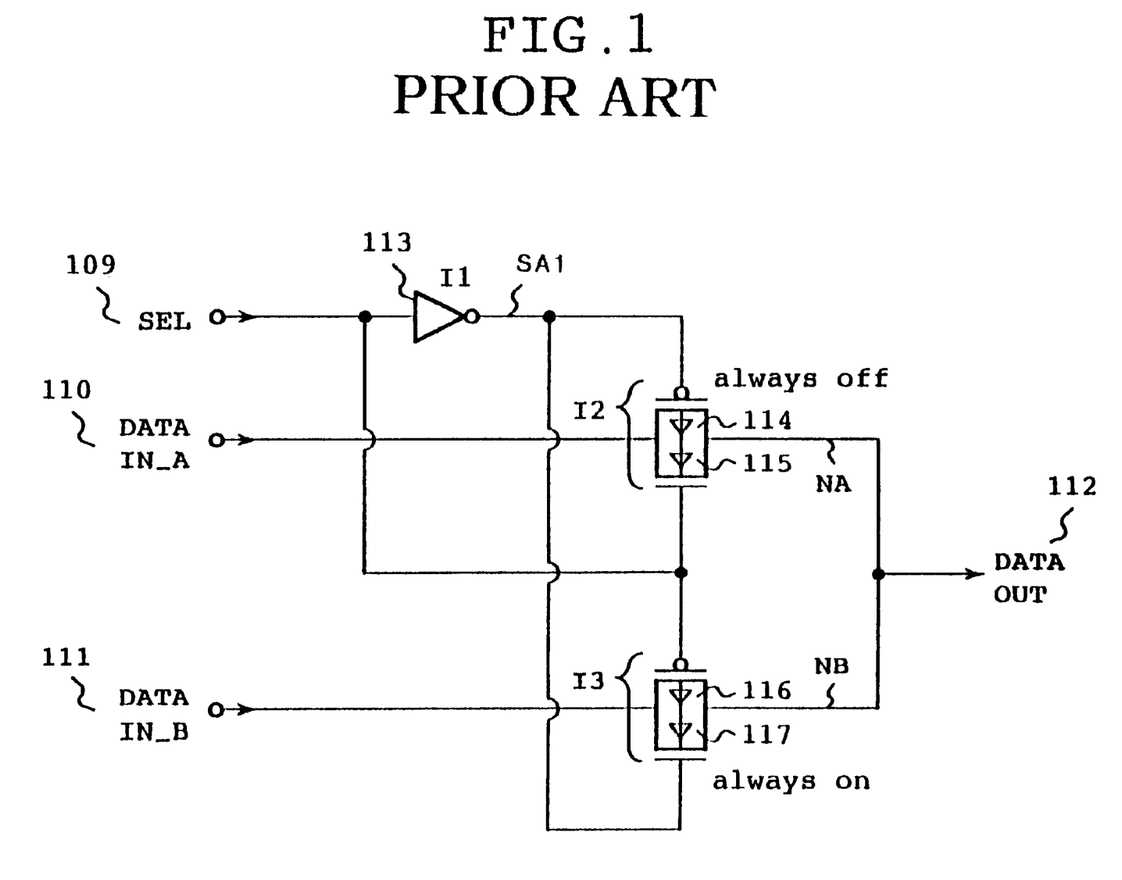
FIG. 1 is a block diagram showing one illustrative verification target circuit in a fault simulation using a conventional fault simulation apparatus.

FIG. 1 is a circuit connection diagram showing a logic circuit serving as a verification target circuit in a fault simulation operation using a conventional fault simulation apparatus (not shown). In FIG. 1, reference number 109 denotes an input terminal of SEL, 110, 111 are input terminals DATAIN_A and DATAIN_B, 112 is an output terminal DATAOUT, I1 is a CMOS circuit including an inverter device 113, I2 is a CMOS circuit including a transistor 114 and an NMOS transistor 115, and I3 is a CMOS circuit including a PMOS transistor 116 and an NMOS transistor 117.

Figure 2:
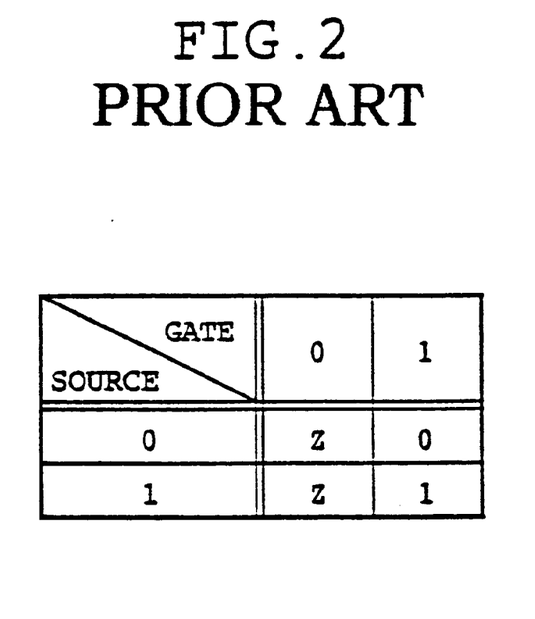
FIG. 2 is a truth table showing logic functions of an NMOS transistor in the verification target circuit shown in FIG. 1.
Figure 3:
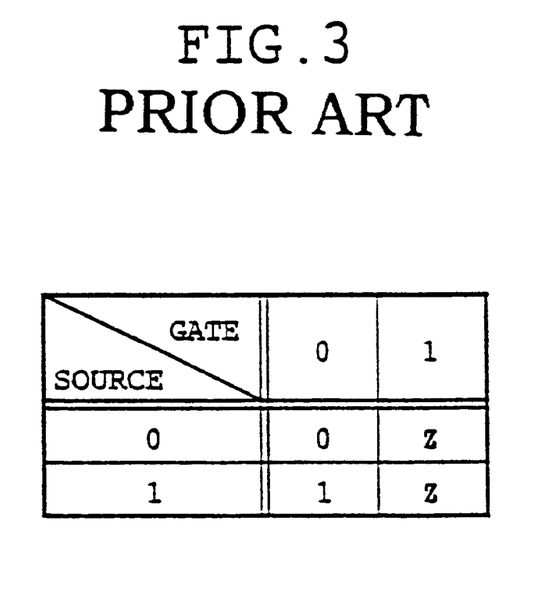
FIG. 3 is a truth table showing logic functions of a PMOS transistor in the verification target circuit shown in FIG. 1.

FIG. 2 is a truth table showing logic functions of the NMOS transistors 115 and 117, and FIG. 3 is a truth table showing logic functions of the PMOS transistors 114 and 116.

Figure 4:
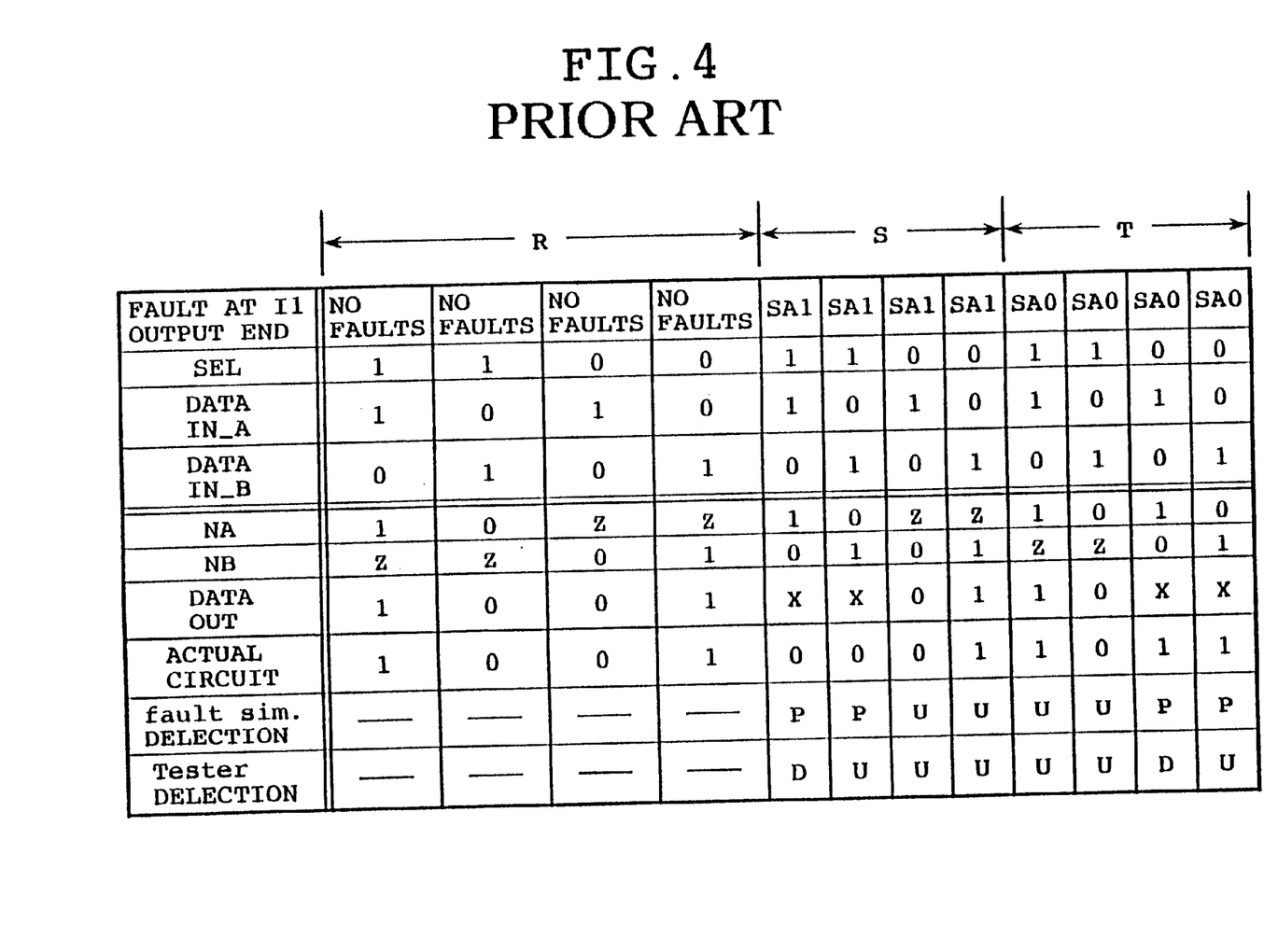
FIG. 4 is a table showing results of fault simulation using the conventional fault simulation apparatus.

FIG. 4 is a table showing results of fault simulation in the circuit connection diagram of FIG. 1. In the table, a region R shows a case where no fault is generated at an output terminal of the inverter device 113, a region S is a case where a Stuck-at 1 fault (short-circuit to a power source) is generated at the output terminal of the inverter device 113, and a region T is a case where a Stuck-at 0 fault (short-circuit to the ground) is generated at the output terminal of the inverter device 113.

A description will now be given of the operation of the conventional fault simulation apparatus.

In a model of the verification target logic circuit of FIG. 1, including the NMOS transistors 115, 117, and the PMOS transistors 114, 116 whose operations are shown in the truth tables of FIGS. 2 and 3, a fault generating portion (not shown) generates the Stuck at 1 (SA1) fault at the output terminal of the inverter device 113. In this case, only the NMOS transistor 115 serving as a transmission gate of the CMOS circuit I2 is operated to output a DATAIN_A signal NA as shown in FIG. 1 irrespective of electric characteristics (such as poor propagation of a logic 1) in logic simulation. Hence, there is a collision between a signal NB of a logic 0 sent from the DATAIN_B through the CMOS circuit I3 and the DATAIN_A signal NA. Since the collision between the signals results in an indefinite value X, it is uncertain whether or not a fault is detected. Consequently, a result is outputted as fault P (Possibility Detect) showing possibility of a pseudo error.

In an actual circuit, however, the NMOS transistor 115 can generally propagate a weak signal NA of a logic 1 so that the PMOS transistor 116 can propagate a strong signal NB of a logic 0, and is at a positive potential with respect to the NMOS transistor 115. Thus, since it is possible to surely detect the fault, a result is detected as a signal D (Definitely Detected Fault) when an actual device (hereinafter referred to as Tester) detection is made to the actual circuit (see FIG. 13).

The conventional fault simulation apparatus is operated in the above manner.

As is apparent from the results of fault simulation shown in FIG. 4, when the conventional fault simulation apparatus is used to generate the fault in the circuit element, and perform the fault simulation, a fault simulation detection (a fault sim. detection) results in frequent occurrence of the pseudo error. As a result, there is a problem in that the results of Tester detection are significantly different from those of actual circuit detection. Hence, there are drawbacks of low reliability of fault coverage as the result of fault simulation obtained by the operation of the conventional fault simulation apparatus, and low efficiency of debugging of the test pattern.

SUMMARY OF THE INVENTION

The present invention is made to overcome the problems in the above conventional fault simulation apparatus. It is an object of the present invention to provide a fault simulation apparatus having the functions of eliminating generation of the pseudo error, and increasing reliability of a fault simulation operation and efficiency of debugging of a test pattern.

According to a preferred embodiment of the present invention, there is provided a fault simulation apparatus including circuit connection data feeding means for feeding circuit connection data to specify a circuit connection in a verification target circuit in a fault simulation, fault generating means for generating a stuck-at fault at input/output of each of devices in the circuit connection data, input pattern signal feeding means for applying a test pattern to a circuit input of the verification target circuit, event generating means for generating, depending upon the test pattern, an event at input/output of each of the devices in the circuit connection data, MOS transistor input signal extracting means for extracting, depending upon the generated event, a MOS transistor serving as the device in which the event occurs at an input terminal and a control terminal of the verification target circuit, and outputting the MOS transistor as an event occurring MOS transistor, MOS transistor output signal strength determining means for extracting the conductivity type of event occurring MOS transistor, a control signal value obtained from the control terminal of the event occurring MOS transistor, and an input signal value obtained from the input terminal of the event occurring MOS transistor, and determining output signal strength when the event occurring MOS transistor is turned ON, and wiring signal value determining means for extracting an output wiring connected to an output terminal of the event occurring MOS transistor, making a signal strength comparison depending upon the output signal strength determined by the MOS transistor output signal strength determining portion when signals are in contention for the output wiring, and the signal strength comparison is made between an output signal of the MOS transistor and another signal fed to the output wiring, and determining a signal value of the output wiring connected to the output terminal of the MOS transistors.

According to another preferred embodiment of the present invention, there is provided a fault simulation apparatus including circuit connection data feeding means for feeding circuit connection data to specify a circuit connection in a verification target logic circuit, fault generating means for generating a stuck-at fault only at a circuit position except a circuit portion in the circuit connection data, at which a pseudo error occurs, input pattern signal feeding means for applying a test pattern to an input end of the verification target logic circuit, event generating means for generating, depending upon the applied test pattern, an event at input/output of each of MOS transistors forming the verification target logic circuit in the circuit connection data, MOS transistor input signal extracting means for extracting, depending upon the generated event, a MOS transistor in which the event occurs at an input terminal or a control terminal from the MOS transistors, and outputting the extracted MOS transistor as an event occurring MOS transistor, MOS transistor output signal determining means for extracting a truth table of the event occurring MOS transistor, and an input signal value obtained from the input terminal of the event occurring MOS transistor, and determining an output signal of the event occurring MOS transistor, and wiring signal value determining means for extracting an output wiring connected to an output terminal of the event occurring MOS transistor, making a signal strength comparison depending upon output signal strength of the MOS transistor output signal determining portion when signals are in contention for the output wiring, and the signal strength comparison is made between an output signal of the MOS transistor and another signal fed to the output wiring, and determining a signal value of the output wiring connected to the output terminal of the MOS transistor.

Further, in the fault simulation apparatus, the fault generating means further comprises mask data feeding means for feeding mask data to the circuit portion at which the pseudo error occurs so as to prevent a stuck-at fault from occurring at the circuit portion in the circuit connection data, at which the pseudo error occurs.

Further, the fault simulation apparatus further comprises fault detection deciding means for making a comparison between a result of simulation in a case where the fault generating means does not generate the stuck-at fault at input/output of each of the devices, and a result of simulation in a case where the stuck-at fault is generated after the completion of the fault simulation.

Further, in the fault simulation apparatus, the event generated by the event generating means is a variation in signal level.

Further, in the fault simulation apparatus, the verification target circuit comprises an N-type MOS transistor functioning according to a truth table having a logical element in which a value of an output signal propagated through the output terminal becomes a signal value "1th" of a threshold level when a signal of a logic 1 is applied to the input terminal and the control terminal, and a P-type MOS transistor functioning according to a truth table having a logical element in which a value of an output signal propagated through the output terminal becomes a signal value "0th" of a threshold level when a signal of a logic 0 is applied to the input terminal and the control terminal.

The above and further objects and novel features of the invention will more fully appear from the following detailed description when the same is read in connection with the accompanying drawings. It is to be expressly understood, however, that the drawings are for purpose of illustration only and are not intended as a definition of the limits of the invention.

DETAILED DESCRIPTION OF THE PREFERRED EMBODIMENTS

A description will now be given of a structure and an operation of a fault simulation apparatus serving as a preferred embodiment of the present invention referring to the accompanying drawings.

FIRST EMBODIMENT

Figure 5:
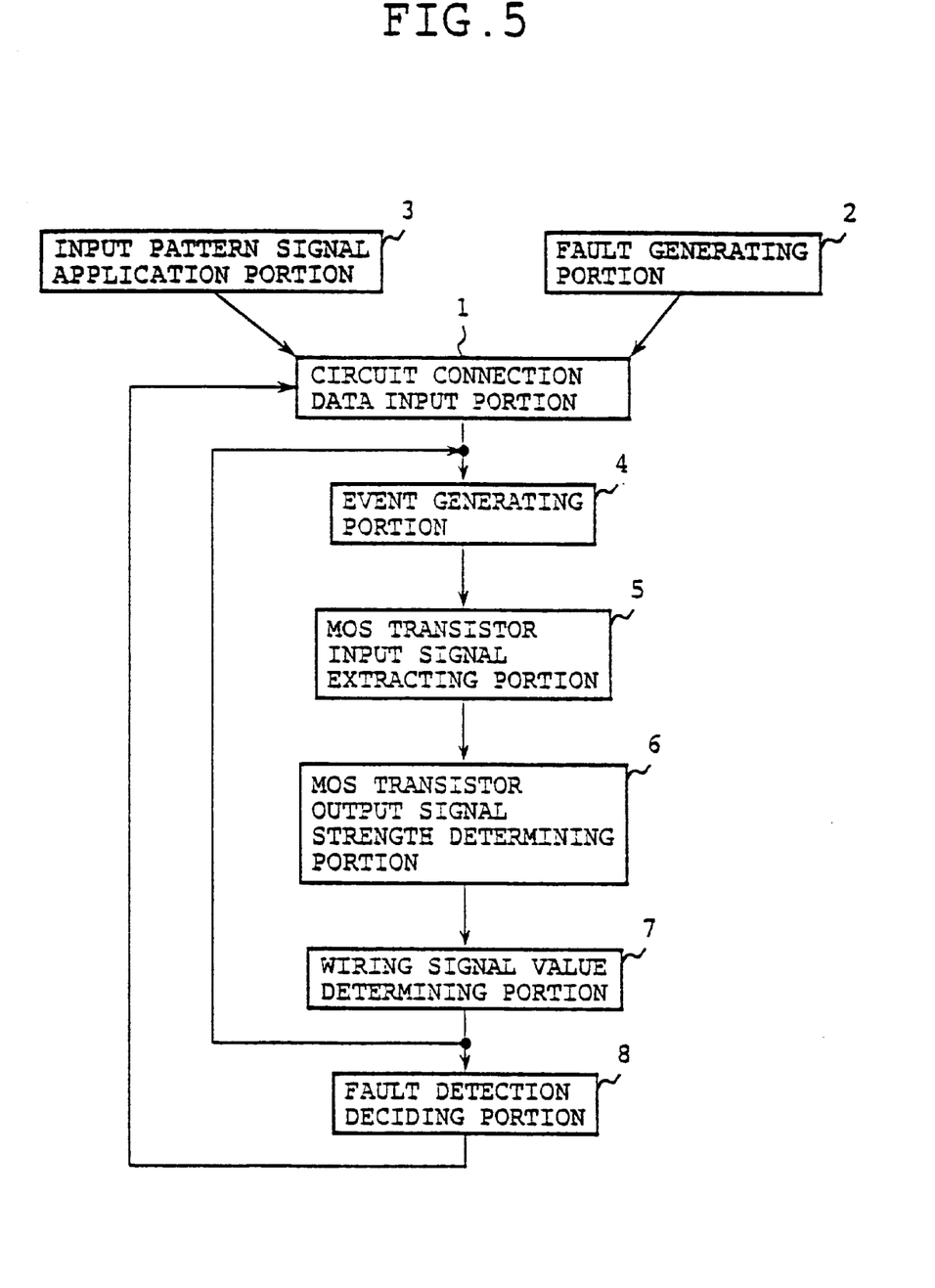
FIG. 5 is a block diagram showing a structure of a fault simulation apparatus according to the first embodiment of the present invention.

FIG. 5 is a block diagram showing a structure of a fault simulation apparatus according to the first embodiment of the present invention. In FIG. 5, reference number 1 designates a circuit connection data portion (circuit connection data means) for inputting and storing circuit connection data to specify a circuit connection in a logic circuit serving as a circuit to be verified. Reference number 2 denotes a fault condition generating portion (fault condition generating means) for generating a stuck-at fault at input/output of each of devices specified by the circuit connection data. The stuck-at fault includes a Stuck-at 1 fault, and a Stuck-at 0 fault. The Stuck-at 1 fault means a short to a power source, and the Stuck-at 0 fault means a short is caused to the ground.

Reference number 3 indicates an input pattern signal application portion (input pattern signal application means) for applying a test pattern to an input end of a logic circuit, 4 is an event generating portion (event generating means) for generating, depending upon the input pattern, an event (a variation in signal) at the input/output of each of devices such as an inverter and a transistor in the circuit connection data, and 5 is an MOS transistor input signal extracting portion (MOS transistor input signal extracting means) for extracting, depending upon the event, an MOS transistor (hereinafter referred to as event occurring MOS transistor) in which the event occurs at an input terminal (source) and a control terminal (gate), and extracting the MOS transistor as event occurring MOS transistor.

Reference number 6 denotes an MOS transistor output signal strength determining portion (MOS transistor output signal strength determining means) for extracting the conductivity type of the event occurring MOS transistor, a control signal value obtained from the control terminal, and an input signal value obtained from the input terminal, and determining output signal strength showing the drive capability of an output signal when the event occurring MOS transistor is turned ON. Reference number 7 designates a wiring signal value determining portion (wiring signal value determining means) for determining a signal value of an MOS transistor output wiring by extracting the MOS transistor output wiring connected to an output terminal of the event occurring MOS transistor, and making a signal strength comparison depending upon the output signal strength obtained from the output signal strength determining portion 6 when signals are in contention for the MOS transistor output wiring, and the signal strength comparison is made between an output signal and another signal fed to the MOS transistor output wiring.

Reference number 8 indicates a fault detection deciding portion for making a decision from a comparison between a result of logic simulation in a case where no fault is generated and a result of logic simulation in a case where a fault is generated.

Figure 6:
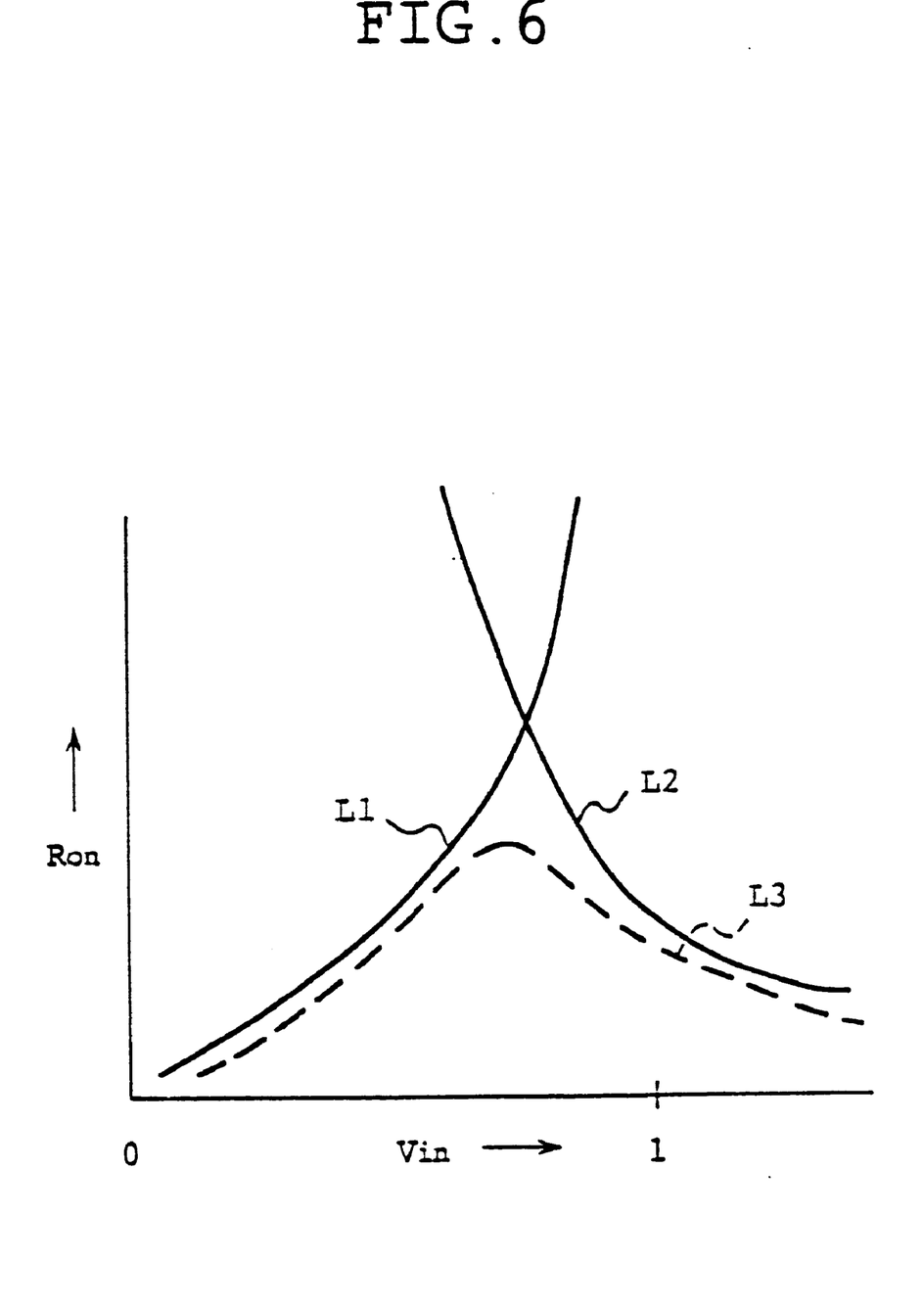
FIG. 6 is a resistance characteristic curve diagram of on resistance $R_{on}$ to input voltage $V_{in}$ in the NMOS transistor and the PMOS transistor.

FIG. 6 is an explanatory view showing resistance characteristic curves of on resistance $R_{on}$ to input voltage $V_{in}$ in an NMOS transistor and a PMOS transistor. In FIG. 6, reference number L1 shows a resistance characteristic curve of the NMOS transistor, L2 is a resistance characteristic curve of the PMOS transistor, and L3 is a resistance characteristic curve of a transmission gate.

As shown in FIG. 6, in the NMOS transistor, the on resistance tends to become greater as an input signal value $V_{in}$ becomes larger (i.e., approaches one). In the PMOS transistor, its on resistance tends to become greater as an input signal $V_{in}$ becomes smaller (i.e., approaches zero).

Figure 7:
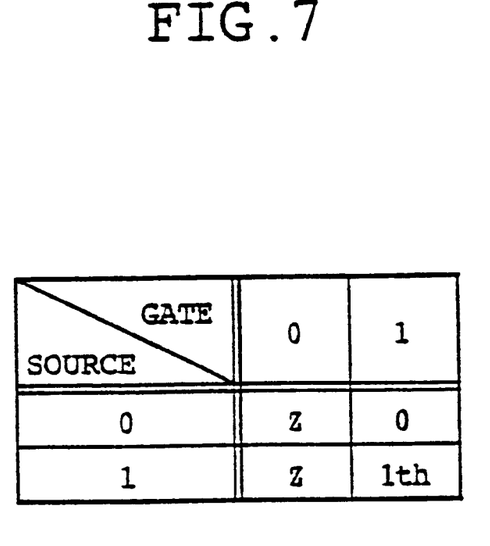
FIG. 7 is a truth table showing logic functions of an NMOS transistor applied to a fault simulation.

FIG. 7 is a truth table showing logic functions of an NMOS transistor applied to a fault simulation in the fault simulation apparatus according to the first embodiment shown in FIG. 5.

In FIG. 7, "1th" indicates a case where an input signal of a logic 1 is applied to a source terminal of the NMOS transistor, and a signal of a logic 1 is applied to a gate terminal. An output voltage propagated through a drain terminal drops from an input voltage by a threshold voltage Vth of the NMOS transistor. Hence, a value of the output signal is defined as a signal value of a threshold level, that is, as a logical element.

Figure 8:
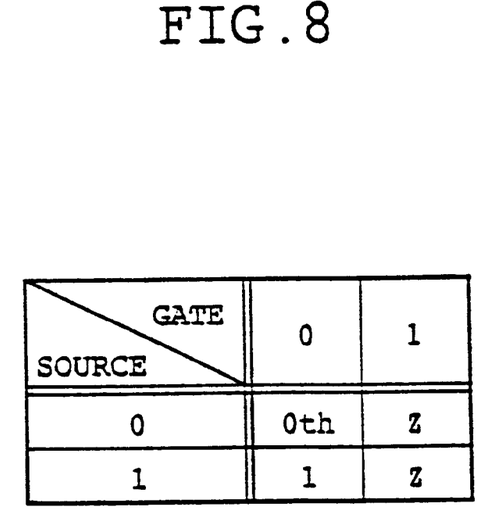
FIG. 8 is a truth table showing logic functions of a PMOS transistor applied to the fault simulation.

FIG. 8 is a truth table showing logic functions of the PMOS transistor applied to the present invention. In FIG. 8, as in the NMOS transistor used in FIG. 7, "0th" indicates a case where an input signal of a logic 0 is applied to a source terminal of the PMOS transistor, and a signal of a logic 0 is applied to a gate terminal. A value of the output signal is defined as a signal value of a threshold level, that is, as a logical element.

Figure 9:
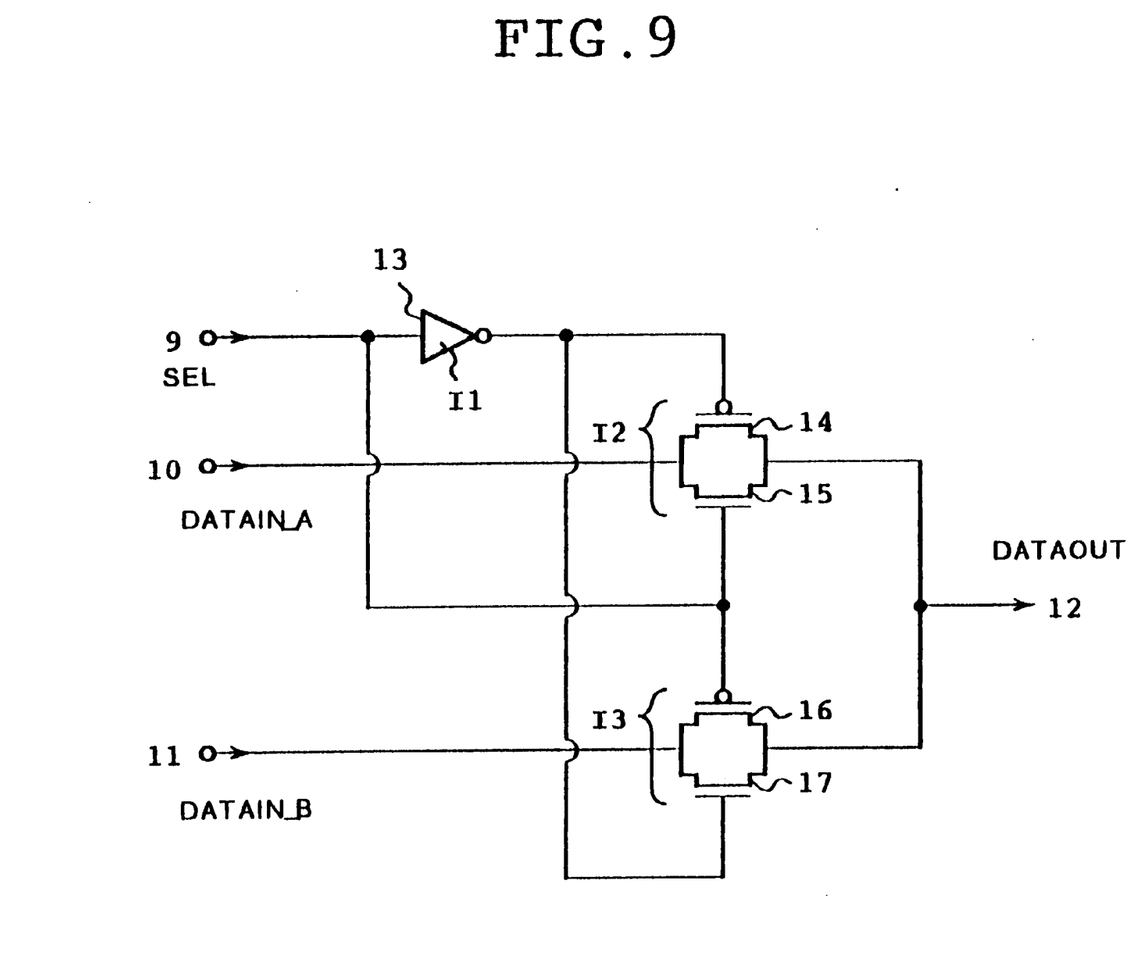
FIG. 9 is a circuit model diagram showing a part of a logic circuit serving as a verification target logic circuit in the fault simulation.

FIG. 9 is a circuit diagram showing a logic circuit to be verified (a verification target logic circuit) in the fault simulation.

In FIG. 9, reference number 9 denotes an input terminal of SEL, 10 and 11 are input terminals of DATAIN_A and DATAIN_B, 12 is an output terminal of DATAOUT, I1 is a CMOS circuit including an inverter device 13, I2 is a CMOS including a PMOS transistor 14 and an NMOS transistor 15, and I3 is a CMOS circuit including a PMOS transistor 16 and an NOS transistor 17.

Next, a description will now be given of the fault simulation of the fault simulation apparatus according to the first embodiment, using the verification target logic circuit shown in FIG. 9.

Figure 10:
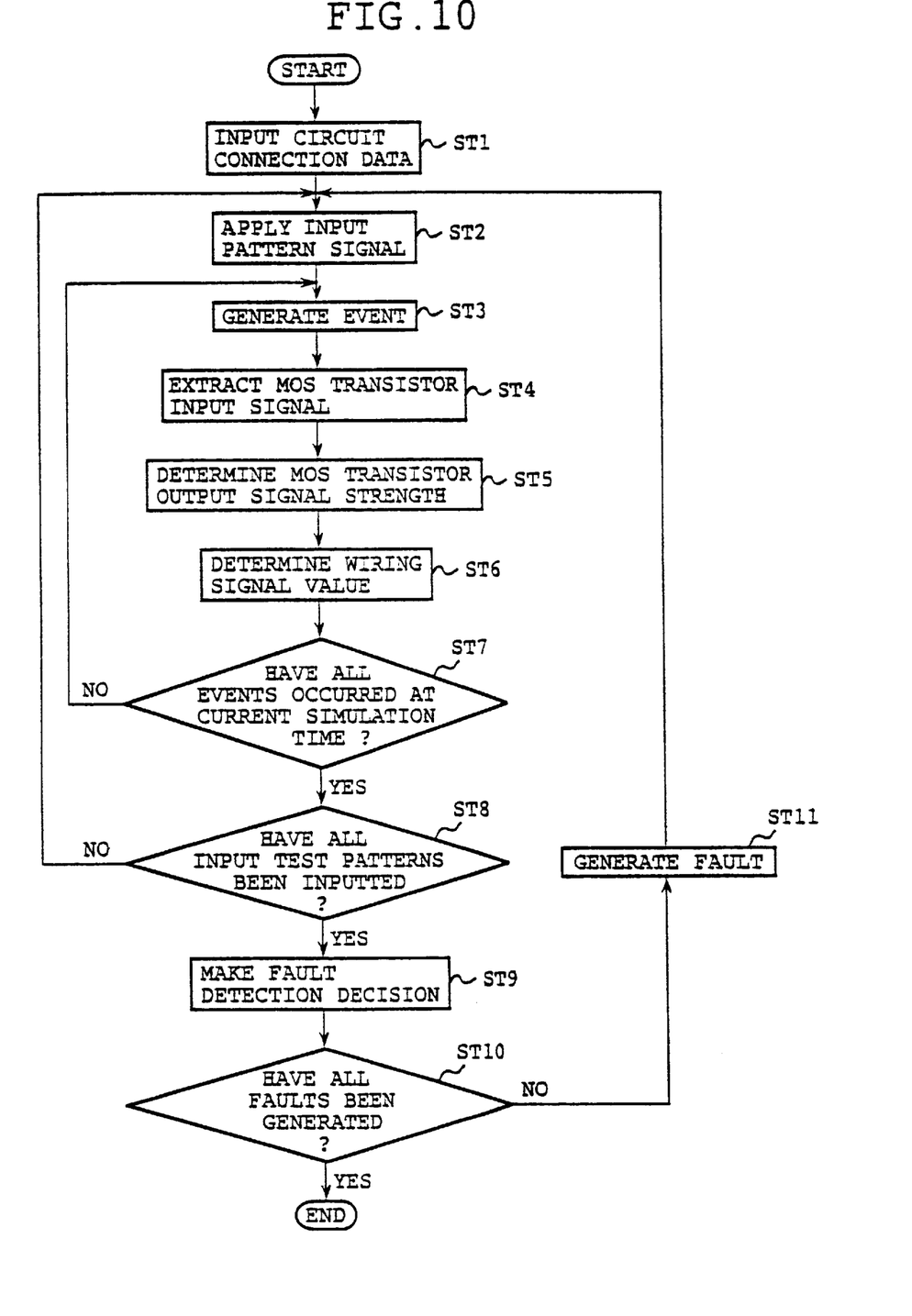
FIG. 10 is a flowchart showing results of fault simulation of a verification target logic circuit, performed by the fault simulation apparatus according to the first embodiment.

FIG. 10 is a flowchart showing the fault simulation of the fault simulation apparatus according to the first embodiment.

After the fault simulation apparatus is started, the circuit connection data input portion 1 is first used to input the circuit connection data to specify the circuit connections in the verification target logic circuit including the MOS transistors (Step ST1).

Subsequently, the test pattern is input by the input pattern signal application portion 3 (Step ST2), and the event generating portion 4 generates an event (Step ST3).

Next, depending upon event information obtained by the event generating portion 4, the MOS transistor input signal extracting portion 5 extracts the type (either NMOS or PMOS) of MOS transistor device in which the event occurs at the input terminal (source) and the control terminal (gate), and values of the signals applied to the source terminal and the gate terminal (Step ST4).

Further, in MOS devices such as P-MOS transistors, and N-MOS transistors, an enhancement transistor generally has electrical characteristics on resistance shown in FIG. 6. Thus, in the MOS transistor output signal strength determining portion 6, the truth tables of FIGS. 7 and 8 are used as operation models for the fault simulation of the PMOS transistors 14 and 16 and the NMOS transistors 15 and 17. That is, the transistors are operated according to the logical functions shown in the truth tables.

With respect to the NMOS transistors 15 and 17 according to the logic functions described above, when a signal of a logic 1 is applied to a source terminal and a gate terminal of the NMOS transistor, a value of an output signal propagated through a drain terminal is defined as a signal value of a threshold level, that is, as a logical element "1th." With respect to the PMOS transistors 14 and 16, when a signal of a logic 0 is applied to a source terminal and a gate terminal of the PMOS transistor, a value of an output signal propagated through a drain terminal is defined as a signal value of a threshold level, that is, as a logical element "0th."

Next, the MOS transistor output signal strength determining portion 6 determines signal strength according to the truth table (Step ST5) to provide a weak output signal for 0 propagation through the PMOS transistor and 1 propagation through the NMOS transistor, and add threshold signal value information "th" to the output signal, thereby outputting the resultant signal.

Subsequently, the wiring signal value determining portion 7 detects the MOS transistor output wiring connected to the output terminal of the event generating MOS transistor. If signals are in contention for the MOS transistor output wiring, and the signal strength comparison is made between the output signal and another signal for feeding a signal to the MOS transistor output wiring, the comparison is made depending upon the signal strength of the output signal to determine the signal value of the MOS transistor output wiring (Step ST6).

Next, a new event is generated depending upon the determined signal value. The event is sequentially propagated to each device in the next stage to continue the logic simulation until output signals of the logic circuit corresponding to all test patterns are obtained. It is decided whether or not all events have occurred at a current simulation time (Step ST7). If YES, it is decided whether or not all input test patterns are inputted (Step ST8).

If a result of decision in Step ST8 is YES, the fault detection deciding portion 8 makes a fault detection decision by making a comparison between a result of logic simulation in a case where no fault is generated and a result of logic simulation in a case where a fault is generated (Step ST9). If both signal values are different, a message is outputted to indicate that the fault can be detected by the input pattern signal. If both the signal values are identical, another message is outputted to indicate that the fault can not be detected.

Thereafter, it is decided whether or not all faults have been generated (Step ST10). If a result of decision is YES, the operation of the fault simulation is ended. If the result of decision is NO, the fault generating portion 2 generates one Stuck-at 1 fault and one Stuck-at 0 fault for each of input/output terminals of another device forming the circuit connection data. Every time the stuck-at faults are generated, the process returns to Step ST2 to perform the logic simulation (Step ST11).

Similarly, the one Stuck-at 1 fault and the one Stuck-at 0 fault are generated for each of input/output terminals of all devices forming the circuit connection data. Every time the stuck-at faults are generated, the logic simulation is performed.

If the result of decision in Step ST7 is NO, the process returns to Step ST3. Further, if the result of decision in Step ST8 is NO, the process returns to Step ST2 to repeat the above operation.

Figure 11:
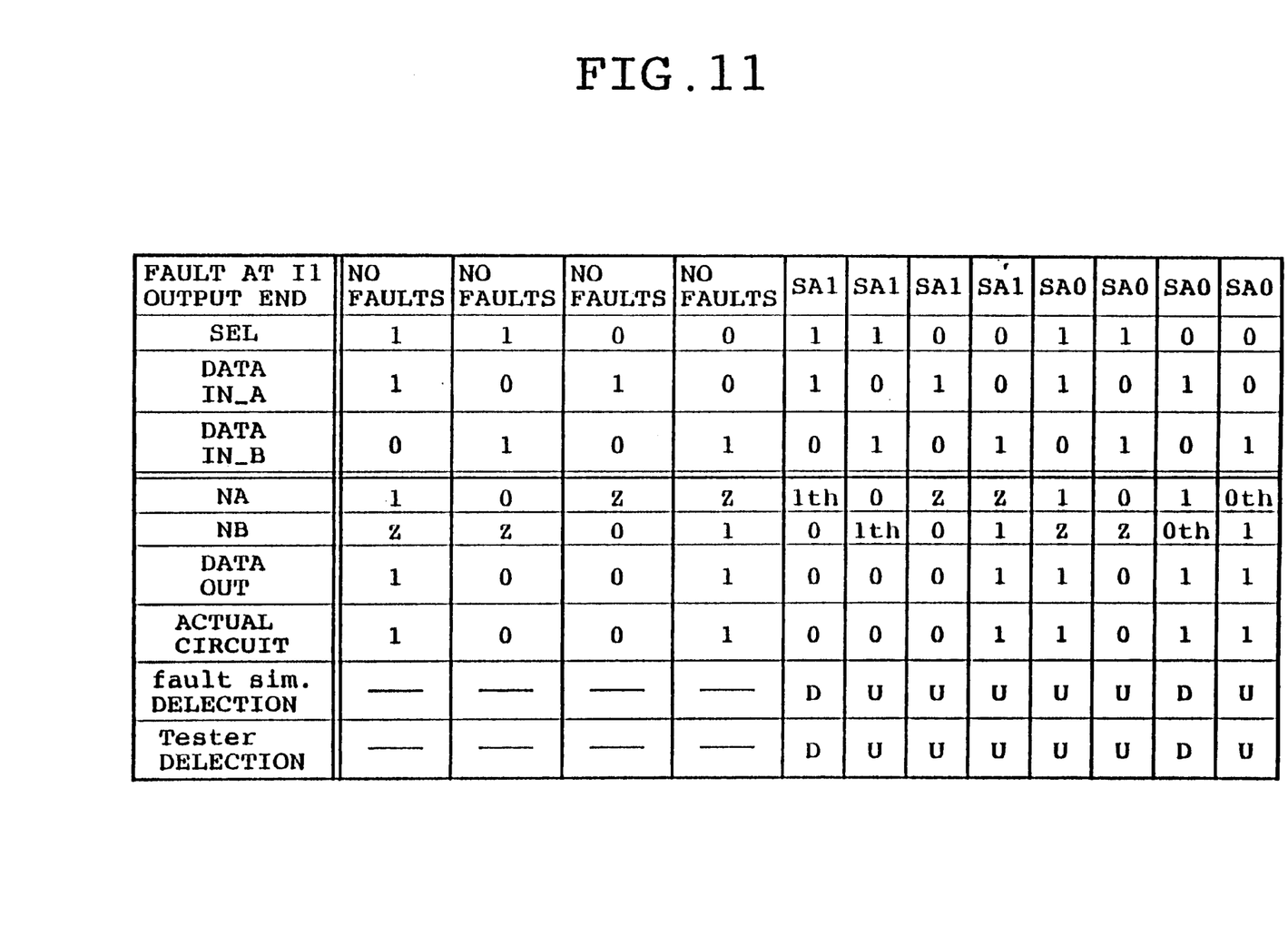
FIG. 11 is a table illustrating the operation of the fault simulation apparatus of the first embodiment shown in FIG. 5.

FIG. 11 is a table illustrating results of the fault simulation performed in the model of the verification target logic circuit of FIG. 9.

As is apparent from the table of FIG. 11, a ratio between output NA of the CMOS circuit 12 and output NB of the CMOS circuit 13 becomes 0: 1th or 1: 0th, the DATAOUT 12 takes one of two values of 1 and 0, and a fault simulation detection (a fault sim. detection) results in either D or U as in a Tester detection.

As set forth above, according to the fault simulation apparatus in the first embodiment, when the signal of the logic 1 is applied to the source terminal and the gate terminal of the NMOS transistor, the output voltage propagated through the drain terminal drops from the input voltage by the threshold voltage Vth of the NMOS transistor. Hence, a value of the output signal is defined as the signal value of the threshold level, that is, the logical element "1th." Like the above operation, when the signal of the logic 0 is applied to the source terminal and the gate terminal of the PMOS transistor, a value of the output signal is defined as the signal value of the threshold level, that is, the logical element "0th." Consequently, the logic circuit always outputs either 1 or 0 according to logic between "1th" and 1, or "0th" and 0, thereby eliminating generation of a pseudo error. As a result, it is possible to provide the same result of logic simulation in both the case where no fault is generated and the case where the fault is generated.

SECOND EMBODIMENT

Figure 12:
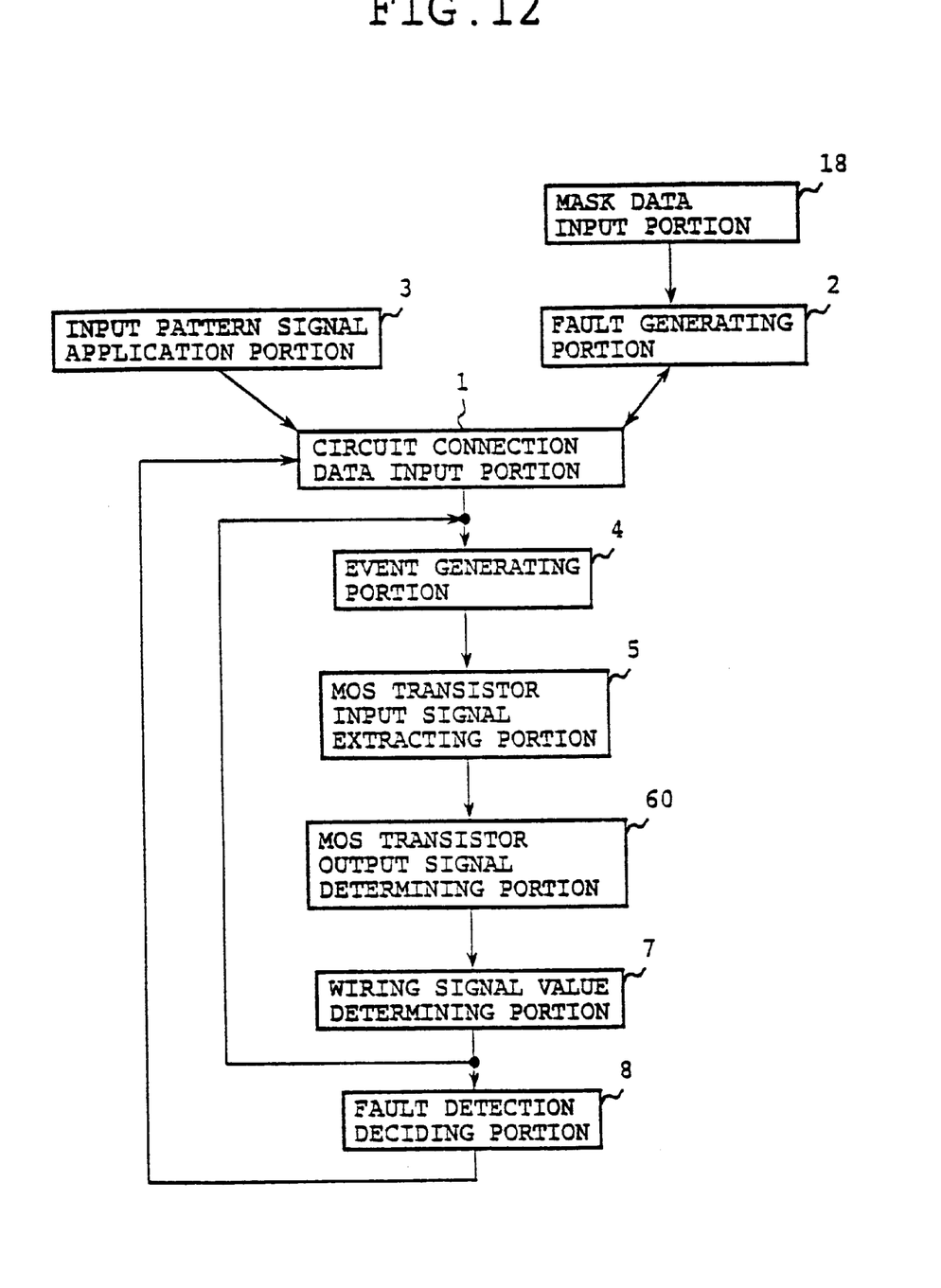
FIG. 12 is a block diagram showing a structure of a fault simulation apparatus according to the second embodiment of the present invention.

FIG. 12 is a block diagram showing a structure of a fault simulation apparatus according to the second embodiment of the present invention. In FIG. 12, reference number 1 designates a circuit connection data input portion for inputting circuit connection data to specify a circuit connection in a logic circuit, 2 is a fault generating portion for generating a fault only at a specific circuit portion in the circuit connection depending upon information from a fault generating position determining portion (not shown), and 3 is an input pattern signal application portion for applying a test pattern to an input end of the logic circuit.

Reference number 4 indicates is an event generating portion for generating, depending upon the input pattern, an event (a variation in signal) at input/output of each of the MOS transistor models in the circuit connection data, 5 is an MOS transistor input signal extracting portion for extracting, depending upon the event information, an MOS transistor in which the event occurs at an input terminal or a control terminal, and outputting the MOS transistor as the event occurring MOS transistor, and 60 is an MOS transistor output signal determining portion (MOS transistor output signal determining means) for determining an output signal of the event occurring MOS transistor by extracting logic functions in a truth table of the event occurring MOS transistor and input signal values obtained from the input terminal and the control terminal.

Reference number 7 denotes a wiring signal value determining portion for determining a signal value of an output wiring by extracting an MOS transistor output wiring connected to an output terminal of the event occurring MOS transistor, and making a signal strength comparison depending upon output signal strength obtained from the MOS transistor output signal determining portion 60 when signals are in contention for the output wiring, and the comparison is made between an output signal and another signal fed to the output wiring.

Reference number 8 indicates a fault detection deciding portion for making a decision by making a comparison between a result of logic simulation in a case where no fault is generated and a result of logic simulation in a case where a fault is generated, and 18 is a mask data input portion (mask data input means) for masking to prevent a stuck-at fault from occurring at a circuit portion in the circuit connection data, at which a pseudo error occurs.

The circuit portion at which the pseudo error occurs is well known to a circuit designer, and such a circuit portion is previously set in the mask data input portion 18.

In the fault simulation apparatus according to the second embodiment, a PMOS transistor and an NMOS transistor used in a verification target logic circuit serving as a candidate for a fault simulation have characteristics shown in the truth tables of FIGS. 7 and 8.

A description will now be given of the operation of the fault simulation apparatus according to the second embodiment.

Figure 13:
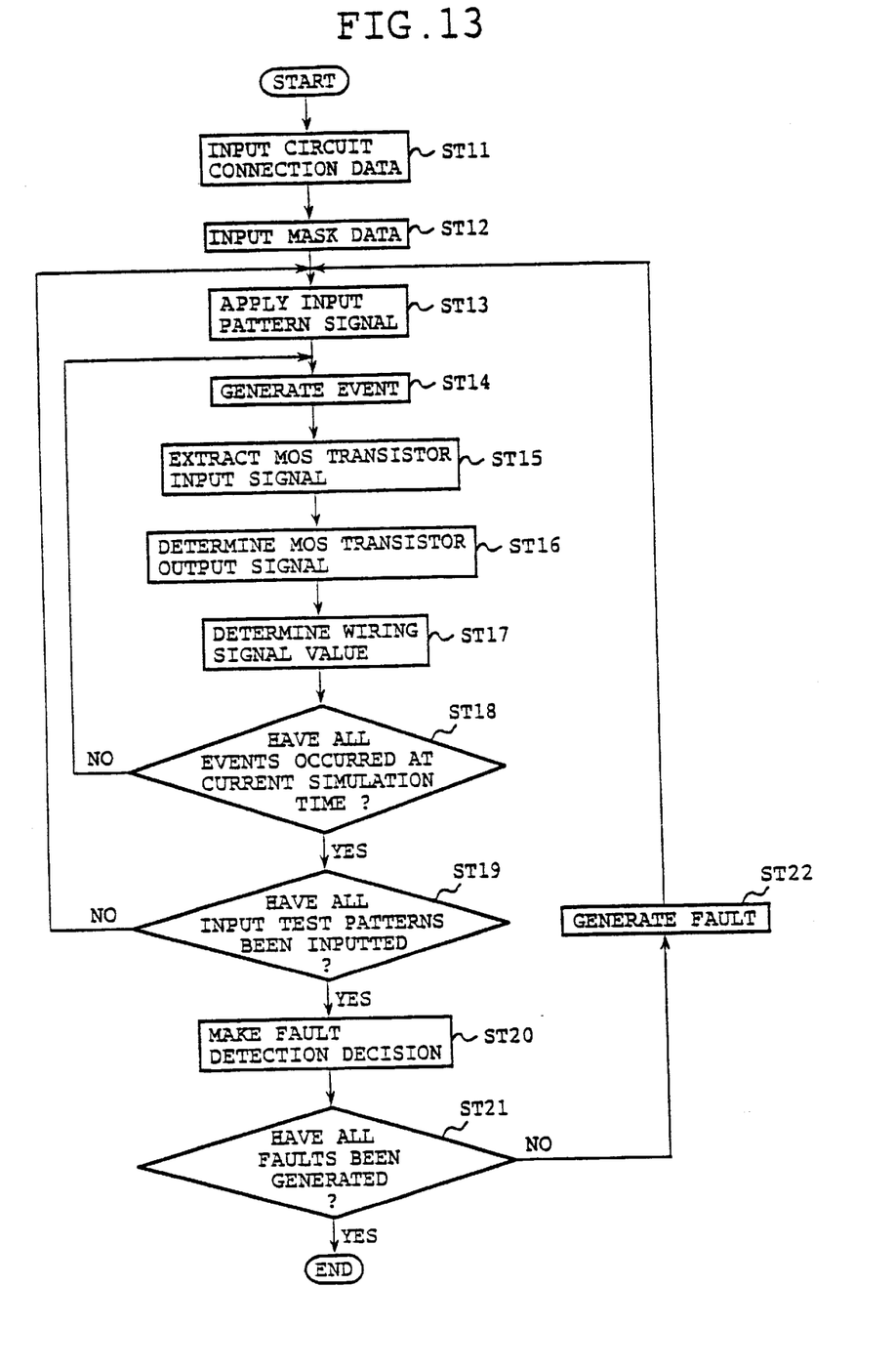
FIG. 13 is a flowchart illustrating the operation of the fault simulation apparatus according to the second embodiment shown in FIG. 12.

FIG. 13 is a flowchart illustrating the operation of the fault simulation in the fault simulation apparatus according to the second embodiment shown in FIG. 12.

First, the circuit connection data input portion 1 is used to input the circuit connection data to specify the circuit connections in the logic circuit (Step ST11).

Next, mask data is input by the mask data input portion 18 to the circuit portion in the circuit connection data, in which the pseudo error occurs (Step ST12).

Thereafter, an input pattern signal is fed by the input pattern signal application portion 3 (Step ST13), and the event is generated by the event generating portion 4 (Step ST14).

Subsequently, depending upon event information obtained in the event generating portion 4, the MOS transistor input signal extracting portion 5 extracts the type of operation of the MOS transistor in which the event occurs at the input terminal and the control terminal, and values of signals applied to the input terminal and the control terminal (Step ST15).

Next, the MOS transistor output signal determining portion 60 determines the output signal depending upon the logic functions of the PMOS transistor and the NMOS transistor shown in the truth tables of FIGS. 7 and 8, and the input signal values obtained from the input terminal and the control terminal of the event occurring MOS transistor (Step ST16).

Further, the wiring signal value determining portion 7 determines the signal value of the MOS transistor output wiring by extracting the MOS transistor output wiring connected to the output terminal of the event occurring MOS transistor, and making the comparison depending upon output signal strength when signals are in contention for the MOS transistor output wiring, and the signal strength comparison is made between the output signal strength of the MOS transistor output signal determining portion 60 and another signal fed to the MOS transistor output wiring (Step ST17).

Subsequently, a new event is generated depending upon the signal value determined in the wiring signal value determining portion 7. The event is sequentially propagated to each device in the next stage to make a decision as to whether or not the logic simulation is continued until the output signals of the logic circuit corresponding to all the test patterns are obtained (Step ST18).

If a result of decision in Step ST18 is NO, the process returns to Step ST14 to repeat the above operation. If the result of decision is YES, it is decided whether or not all the input patterns have been inputted (Step ST19).

If a result of decision in Step ST19 is YES, the fault detection deciding portion 8 makes the fault decision by making the comparison between the result of logic simulation in the case where no fault is generated and the result of logic simulation in the case where the fault is generated (Step ST20).

On the other hand, if both signal values are different, a message is outputted to indicate that the fault can be detected by the input pattern signal. If both the signal values are completely identical, another message is output to indicate that the fault can not be detected.

Thereafter, it is decided whether or not all faults have been generated (Step ST21). If the result of the decision is YES, the operation is ended. If the result of the decision is NO, the fault generating portion 2 generates one Stuck-at 1 fault and one Stuck-at 0 fault for each of input/output terminals of the MOS transistor forming the circuit connection data (Step ST22). Every time the stuck-at faults are generated, the logic simulation is performed. When the fault is generated, a selector circuit, a multiplexer circuit, and a synchronous latch circuit are detected from the circuit connection data depending upon the connection. In the circuits, predetermined pseudo error occurring positions (including an output end of an inverter device 13, a gate terminal of a PMOS transistor 14, and a gate terminal of an NMOS transistor 17 in FIG. 9) are masked by the mask data input portion 18 to avoid generation of the stuck-at fault as described above.

As set forth above, according to the fault simulation apparatus of the second embodiment, the mask data is input to the pseudo error occurring position in the circuit connection data, thereby eliminating occurrence of a fault. As a result, it is possible to eliminate the pseudo error, and provide the same result of logic simulation in both the case where no fault is generated and the case where the fault is generated.

As stated above in detail, according to the present invention, there is provided the fault simulation apparatus including the MOS transistor output signal strength determining means for extracting the conductivity type of event occurring MOS transistor, the control signal value obtained from the control terminal, and the input signal value obtained from the input terminal, and determining the output signal strength when the event occurring MOS transistor is turned ON. Therefore, it is possible to eliminate the pseudo error which has frequently occurred in the prior art in the fault simulation with respect to full-custom design data including the switch levels (MOS transistors), resulting in an effect of higher reliability of the result of fault simulation.

Further, according to the fault simulation apparatus of the present invention, there is provided the verification target logic circuit including the NMOS transistor in which the value of the output signal propagated through the drain terminal is defined as the signal value of the threshold level, that is, the logical element "1th" when the signal of the logic 1 is applied to the source terminal and the gate terminal, and the PMOS transistor in which the value of the output signal propagated through the drain terminal is defined as the signal value of the threshold level, that is, the logical element "0th" when the signal of the logic 0 is applied to the source terminal and the gate terminal. Therefore, it is possible to easily determine the output signal strength when the event occurring MOS transistor is turned ON, and eliminate generation of the pseudo error, resulting in an effect of higher reliability of the result of fault simulation.

Further, according to the fault simulation apparatus, the Stuck-at 1 fault and the Stuck-at 0 fault are generated in the verification target circuit except the circuit portion at which the pseudo error occurs. Therefore, it is possible to eliminate generation of the pseudo error, resulting in higher reliability of the result of fault simulation.

Further, according to the fault simulation apparatus of the present invention, the mask data is fed by the mask data feeding means to prevent the fault from occurring at the circuit portion of the circuit to be verified, at which the pseudo error occurs. Therefore, in the fault simulation with respect to the full-custom design data including the switch levels (MOS transistors), it is possible to completely eliminate generation of the pseudo error which has frequently occurred in the prior art, resulting in higher reliability of the result of fault simulation.

While preferred embodiments of the invention have been described using specific terms, such description is for illustrative purposes only, and it is to be understood that changes and variations may be made without departing from the spirit or scope of the following claims.

What is claimed is:

1. A fault simulation apparatus comprising:

circuit connection data input means for inputting circuit connection data to specify a plurality of devices in circuit connections of a verification target circuit in a fault simulation;

fault condition generating means for generating a stuck-at fault condition at an input or an output of each of the devices specified by the circuit connection data;

input pattern signal application means for applying a test pattern to an input of the verification target circuit;

event generating means for generating, depending upon the test pattern, an event at an input or an output of each of the devices specified by the circuit connection data;

MOS transistor input signal extracting means for extracting, depending upon the generated event, data specifying an MOS transistor in which the event occurs at an input terminal and a control terminal of the MOS transistor, and outputting the data specifying the MOS transistor as an event occurring MOS transistor;

MOS transistor output signal strength determining means for extracting a conductivity type from the data specifying the event occurring MOS transistor, a control signal value obtained from a control terminal of the event occurring MOS transistor, and an input signal value obtained from an input terminal of the event occurring MOS transistor, and determining signal strength of a first signal output from the event occurring MOS transistor when the event occurring MOS transistor is turned ON; and wiring signal value determining means for extracting data specifying output wiring connected to an output terminal of the event occurring MOS transistor, comparing the signal strength of the first signal determined by the MOS transistor output signal strength determining means with signal strength of a second signal output from a device other than the event occurring MOS transistor specified by the circuit connection data when the first and second signals are in contention for the output wiring, and determining whether a signal value of a third signal output from the output wiring connected to the output terminal of the event occurring MOS transistor is logic "1" or logic "0", based on comparison of the signal strengths of the first and second signals, wherein operation of the verification target circuit including the MOS transistor is verified based on the signal value of the third signal.

2. The fault simulation apparatus according to claim 1, wherein, during a first simulation, the fault condition generating means does not generate a fault condition at the input or the output of any of the devices specified by the circuit connection data and the wiring signal value determining means determines a first signal value of the third signal based on the first simulation, and, during a second simulation, the fault condition generating means generates a stuck-at fault condition at the input or the output of one of the devices specified by the circuit connection data and the wiring signal value determining means determines a second value for the third signal based on the second simulation, wherein the fault simulation apparatus further comprises fault detection deciding means for comparing the first and second signal values to determine whether the second signal value indicates the stuck-at fault condition.

3. The fault simulation apparatus according to claim 1, wherein the event generated by the event generating means is a variation in signal level.

4. The fault simulation apparatus according to claim 1, wherein the input terminal of the event occurring MOS transistor is a source terminal, the control terminal is a gate terminal, and the output terminal is a drain terminal.

5. The fault simulation apparatus according to claim 1, wherein the verification target circuit comprises:

an N-type MOS transistor having an input terminal, an output terminal, and a control terminal, the N-type MOS transistor functioning according to a truth table, wherein, when a signal having a first voltage indicative of logic "1" is applied to the input terminal and the control terminal, a value of an output signal propagated to the output terminal becomes equal to the first voltage minus a threshold voltage of the N-type MOS transistor; and a P-type MOS transistor having an input terminal, an output terminal, and a control terminal, the P-type MOS transistor functioning according to a truth table wherein, when a signal having a second voltage indicative of logic "0" is applied to the input terminal and the control terminal, a value of an output signal propagated to the output terminal becomes equal to a threshold voltage of the P-type MOS transistor.

6. The fault simulation apparatus according to claim 5, wherein, during a first simulation, the fault condition generating means does not generate a fault condition at the input or the output of any of the devices specified by the circuit connection data and the wiring signal value determining means determines a first signal value of the third signal based on the first simulation, and, during a second simulation, the fault condition generating means generates a stuck-at fault condition at the input or the output of one of the devices specified by the circuit connection data and the wiring signal value determining means determines a second value for the third signal based on the second simulation, wherein the fault simulation apparatus further comprises fault detection deciding means for comparing the first and second signal values to determine whether the second signal value indicates the stuck-at fault condition.

7. The fault simulation apparatus according to claim 5, wherein the event generated by the event generating means is a variation in signal level.

8. The fault simulation apparatus according to claim 5, wherein the input terminal of the event occurring MOS transistor is a source terminal, the control terminal is a gate terminal, and the output terminal is a drain terminal.

9. A fault simulation apparatus comprising:

circuit connection data input means for inputting circuit connection data to specify a plurality of devices in circuit connections of a verification target logic circuit;

fault condition generating means for generating a stuck-at fault condition at a circuit position, excluding a circuit specified by the circuit connection data at which a pseudo error occurs;

input pattern signal application means for applying a test pattern to an input of the verification target logic circuit;

event generating means for generating, depending upon the test pattern, an event at an input or an output of each of the devices specified by the circuit connection data;

MOS transistor input signal extracting means for extracting, depending upon the generated event, data specifying an MOS transistor, having an input terminal, an output terminal and a control terminal, in which the event occurs at the input terminal or the control terminal, and outputting the data specifying the MOS transistor as an event occurring MOS transistor;

MOS transistor output signal determining means for extracting a truth table of the event occurring MOS transistor, and an input signal value obtained from an input terminal of the event occurring MOS transistor, and determining signal strength of a first signal output from the event occurring MOS transistor based on the input signal value and the truth table; and wiring signal value determining means for extracting data specifying output wiring connected to an output terminal of the event occurring MOS transistor, comparing the signal strength of the first signal determined by the MOS transistor output signal determining means with signal strength of a second signal output from a device other than the event occurring MOS transistor specified by the circuit connection data when the first and second signals are in contention for the output wiring, and determining whether a signal value of a third signal output from the output wiring connected to the output terminal of the event occurring MOS transistor is logic "0" or logic "1," based on comparison of the signal strengths of the first and second signals, wherein an operation of the verification target circuit including the MOS transistor is verified based on the signal value of the third signal.

10. The fault simulation apparatus according to claim 9, wherein the fault generating means comprises mask data input means for inputting mask data to the circuit at which the pseudo error occurs to prevent a stuck-at fault from occurring at the circuit specified by the circuit connection data at which the pseudo error occurs.

11. The fault simulation apparatus according to claim 9, wherein the input terminal of the event occurring MOS transistor is a source terminal, the control terminal is a gate terminal, and the output terminal is a drain terminal.

12. The fault simulation apparatus according to claim 9, wherein the event generated by the event generating means is a variation in signal level.

* * * * *